United States Patent [19]
Eitrheim et al.

[11] Patent Number: 5,359,232
[45] Date of Patent: Oct. 25, 1994

[54] CLOCK MULTIPLICATION CIRCUIT AND METHOD

[75] Inventors: John K. Eitrheim, Garland; Richard B. Reis, McKinney, both of Tex.

[73] Assignee: Cyrix Corporation, Richardson, Tex.

[21] Appl. No.: 975,809

[22] Filed: Nov. 13, 1992

Related U.S. Application Data

[63] Continuation-in-part of Ser. No. 880,550, May 8, 1992, Pat. No. 5,336,939.

[51] Int. Cl.$^5$ ............................................... H03K 5/01
[52] U.S. Cl. ................................... 307/268; 307/265; 377/47
[58] Field of Search ............ 307/268, 269, 265, 272.1, 307/281, 271; 377/47; 328/63, 155, 15

[56] References Cited

U.S. PATENT DOCUMENTS

| | | | |
|---|---|---|---|
| 4,025,866 | 5/1977 | Fletcher et al. | 377/47 |
| 4,077,010 | 2/1978 | Ryon | 377/47 |
| 4,339,722 | 7/1982 | Sydor et al. | 377/47 |
| 4,623,846 | 11/1986 | LaMacchia | 307/265 |
| 4,669,099 | 5/1987 | Zimm | 377/47 |
| 4,748,348 | 5/1988 | Thong | 328/55 |
| 4,937,468 | 6/1990 | Shekhawat et al. | 307/268 |
| 4,968,907 | 11/1990 | Pepper | 328/63 |
| 4,985,639 | 1/1991 | Renfrow et al. | 307/268 |
| 4,985,640 | 1/1991 | Grochowski et al. | 307/269 |
| 4,994,687 | 2/1991 | Fujii et al. | 307/268 |
| 5,059,818 | 10/1991 | Witt et al. | 307/269 |
| 5,063,578 | 11/1991 | Diodato | 377/47 |
| 5,077,686 | 12/1991 | Rubinstein | 377/47 |
| 5,079,440 | 1/1992 | Roberts et al. | 328/63 |
| 5,103,114 | 4/1992 | Fitch | 307/265 |
| 5,198,709 | 3/1993 | O'Connell | 307/269 |

Primary Examiner—Timothy P. Callahan
Assistant Examiner—T. T. Lam
Attorney, Agent, or Firm—Andrew S. Viger; John L. Maxin

[57] ABSTRACT

An integrated circuit, such as a microprocessor or math coprocessor, having a clock generator circuit for generating a high frequency internal clock signal based on an external input signal is disclosed. A clock generator circuit comprises circuitry for detecting an active edge of an input signal, circuitry for generating a plurality of clock edges responsive to the detection of the clock signal and circuitry for inhibiting the edge generating circuitry after generation of a predetermined number of clock edges. The factor by which the input clock signal is multiplied may be set by the circuit designer, or programmably set, without impact on the circuit design. Hence, a single circuit may be used to generate clocks of various frequencies. Further, the duty cycle of the generated clock is independent of the input clock signal.

17 Claims, 6 Drawing Sheets

CLOCK MULTIPLICATION CIRCUIT AND METHOD

RELATED APPLICATIONS

This application is a continuation-in-part of co-pending U.S. patent application Ser. No. 880,550, now U.S. Pat. No. 5,336,939 titled "Stable Internal Clock Generation For An Integrated Circuit", filed May 8, 1992, (Attorney Docket No. CX-00117/CYR300/4-6), which is assigned to the assignee of this application and incorporated by reference herein. This application is related to co-pending U.S. patent application Ser. No. 07/880,751, now abandoned titled "Clock Generator Circuit With Selectable Modes", filed May 8, 1992 (Attorney Docket No. CX-00118/CYR300/4-10), the disclosure of which are incorporated by reference.

TECHNICAL FIELD OF THE INVENTION

This invention relates generally to digital circuits, and more particularly relates to a clock multiplication circuit and method for generating clock signals that are a higher frequency than an input clock.

BACKGROUND OF THE INVENTION

Microprocessors, and other clocked logic circuits, commonly use an internal clock derived from an external input clock—such as a computer system clock—to permit synchronous operations. Clock multiplication is used in current microprocessor designs to achieve performance increases by increasing the internal CPU clock relative to the external system clock.

Without limiting the scope of the invention, this background information is provided in the context of a specific problem to which the invention has application: in a microprocessor, an improved technique for generating an internal clock that is higher in frequency than the input system clock, and that has a duty cycle that does not depend on the duty cycle of the system clock.

In computer systems using the 386 bus architecture, the microprocessor receives an external system clock that is twice the internal CPU clock (CLK2)—the microprocessor divides CLK2 to obtain a clean internal CPU clock (CLK) with well-defined transitions and duty cycle. In later generation computer systems using the 486 bus architecture, the microprocessor conventionally operates in what is called a 1X clock mode, with the internal CPU clock being at the same frequency as the external computer system clock. Phase lock loop (PLL) circuitry in combination with divide-by-two logic is used to obtain a CPU clock that is stable relative to the input clock frequency and has a 50—50 duty cycle. To enhance performance of these 486-bus computer systems without requiring an increase in the computer system clock, some 486-type microprocessors employ a technique called "clock doubling" in which the microprocessor includes clock multiplication circuitry to generate an internal CPU clock that is twice the frequency of the input clock from the computer system. In these microprocessors, the CPU core runs at the 2X clock rate while the bus interface logic operates at the 1X clock rate used by the computer system.

Current clock multiplication techniques typically employ phase locked loop (PLL) circuits in combination with frequency divider logic—the ratio of the frequency dividers in the output and feedback loops determines the relative frequency between the generated clock signals and the input clock frequency.

This clock multiplication approach is disadvantageous in several respects. PLL circuits are generally limited in operating power supply voltage range, and therefore are not well suited for microprocessors designed to operate with both 5 volt and 3.3 volt power supplies. Moreover, PLL circuits do not support switching between different clock rates (including clock stopping to preserve power) because exceeding a specified slew rate will cause a PLL to drop frequency lock. In addition, the use of frequency division to control duty cycle does not provide much flexibility in controlling the duration of both phases of the clock signal. Accordingly, a specific object of the invention is to provide an improved clock multiplier circuit for a microprocessor capable of generating a higher frequency CPU clock with a duty cycle that does not depend on the input clock duty cycle. A more general object is to implement clock multiplication using one or more delay lines to generate a selected number of transitions between the active edges of an input clock, each defining a clock phase of a selected duration.

SUMMARY OF THE INVENTION

The invention involves generating a clock signal in response to an input clock signal.

In one aspect of the invention, the generated clock signal is produced by detecting an active edge of the input clock signal, generating a plurality of clock edges responsive to the detection of the active edge and inhibiting generation of additional edges after the generation of predetermined number of clock edges.

In an exemplary embodiment of the invention, a SR flip-flop generates clock edges for the generated clock signal in response to an active edge of the CLKIN signal. After detecting an active edge, delay circuits and edge detectors drive the clock generation circuit. The counter is incremented in response to pulses output from edge detector 102*b*. When the output of counter 106 equals a predetermined number (n), a comparator outputs a signal which in connection with an AND gate, inhibits the generation of further clock edges.

The technical advantages of the invention include the following. An input clock signal may be multiplied by a factor which is either hard-wired in the circuit or stored in the memory. Only a single delay circuit is used to implement a multiplied clock signal with a 50% duty cycle and only two delay circuits are necessary to implement a clock multiplier circuit with a duty cycle other than 50%. The delay stages which determine the phase duration of the generated clock may be implemented to overcome variances in temperature, voltage and manufacturing parameters.

For a complete understanding of the invention and for further features and advantages, reference is now made to the Detailed Description of the exemplary embodiments of the invention, together with the accompanying Drawings, it being understood that the invention encompasses any modifications or alternative embodiments that fall within the scope of the claims.

DETAILED DESCRIPTION OF THE INVENTION

Figure 1:
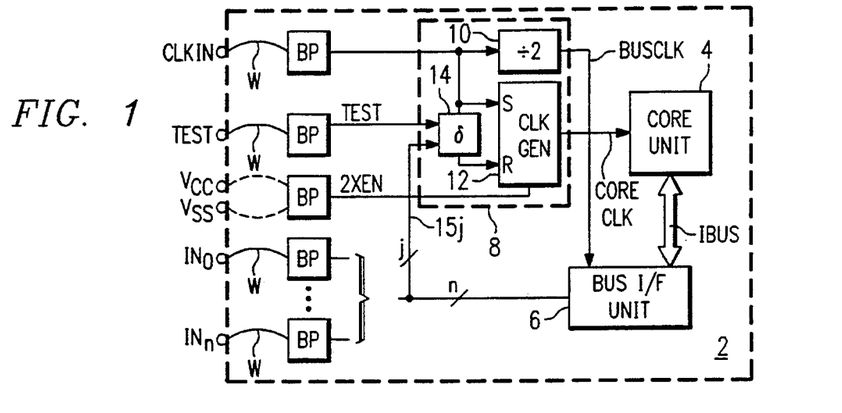
FIG. 1 is an electrical diagram, in block form, of an integrated circuit incorporating the preferred embodiment of the invention.

Referring first to FIG. 1, the construction of integrated circuit 2, such as a microprocessor, math co-processor or the like having at least two different functions which can operate at different clock frequencies, and thus in which the preferred embodiment of the invention is implemented will be described. In this example, integrated circuit 2 includes a core unit 4 which performs a sequence of instructions or some other complex logic operation, preferably at the fastest possible clock frequency to optimize circuit performance. Integrated circuit 2 further includes bus interface unit 6 which is in communication with input and output terminals (not shown) of integrated circuit 2, and is also in communication with core unit 4 by way of internal bus IBUS. Bus interface unit 6 is intended to receive input signals presented at address and data input terminals, to control the operation of core unit 4 and other functions in integrated circuit 2, and also to control the presentation of output data at output terminals; since the timing requirements of bus interface unit 6 are governed by the input/output specifications of other integrated circuits in the system, it may require a slower clock frequency than that usable by core unit 4.

For reference hereinbelow, certain of the input terminals to integrated circuit 2 are illustrated in FIG. 1 as being connected to circuitry via a bond wire W and a bond pad BP. Other inputs and outputs are, of course, similarly connected but are not shown in FIG. 1 for purposes of clarity. The illustration of the bond pads BP in FIG. 1 will become apparent relative to the optional wire bonding of one of the bond pads BP discussed hereinbelow. In addition, conventional input buffer circuits may also be provided within integrated circuit 2 in the conventional manner; such buffers are also not illustrated in FIG. 1 for purposes of clarity.

In the example of FIG. 1, integrated circuit 2 is operable to receive an input clock signal at terminal CLKIN. The input clock signal may be an externally generated periodic clock, such as from an external oscillator, or alternatively the input clock signal may be generated on-chip based on a crystal connected to terminal CLKIN that determines the clock frequency. Clock control circuit 8 presents to core unit 4 (on line CORECLK) an internal clock signal at the same frequency as the input clock signal at terminal CLKIN, and presents to bus interface unit 6 (on line BUSCLK) an internal clock signal at one-half the frequency of the input clock signal received at terminal CLKIN. The half-frequency clock signal is generated and applied to line BUSCLK by frequency divider 10, which in this case divides the input clock signal frequency by two prior to its presentation on line BUSCLK.

According to the preferred embodiment of the invention, clock control circuit 8 further includes clock generator 12 which receives the input clock signal from terminal CLKIN at a "set" input, and which receives the input clock signal from terminal CLKIN, delayed by programmable delay stage 14, at a "reset" input. Programmable delay stage 14 in this embodiment of the invention includes a default delay value that is enabled for normal (non-test mode) operation, implemented within programmable delay stage 14 by the metallization pattern or by way of fusible links or other programmable elements (FAMOS transistors, etc.). In addition, programmable delay stage 14 also receives a test input from terminal TEST and j select lines $15_j$ from selected input terminals $IN_o$ through $IN_n$ so that, in a special test mode selected by the logic state applied to terminal TEST, the j select lines $15_j$ can select a portion of the delay period through delay stage 14.

Programmable delay stage 14 and clock generator 12 each also receive an input on line 2XEN indicating if the clock doubling mode is to be enabled; when enabled, the clock doubling mode causes the core unit clock frequency on line CORECLK to be twice that of the bus clock frequency on line BUSCLK. In this example, selection of the clock doubling feature is made at the wire bonding step of the manufacturing process, by connecting the bond pad BP associated with line 2XEN to be connected to the $V_{cc}$ power supply terminal (which, in this example, enables clock doubling) or to the $V_{ss}$ or ground terminal (disabling clock doubling).

As will be described hereinbelow, clock control circuit 8 according to this embodiment of the invention is controlled by the state of line 2XEN, so that the clock signal on line CORECLK may be generated either in a clock doubling mode or in a non-clock doubling mode. In addition, interface circuitry controlling the communication of data on internal bus IBUS is also preferably controlled according to the state of line 2XEN, so that communication between core unit 4 and bus interface unit 6 can be performed according to the selected internal clock relationship. It is contemplated that the construction of such interface circuitry will be apparent to one of ordinary skill in the art having reference to this specification.

In the general sense, clock generator 12 operates in the clock doubling mode to respond to one of the input clock signal edges; for purposes of this description, the term "rising edge" will refer to a low-to-high transition for a signal, and the term "falling edge" will refer to a high-to-low transition. In the example of FIG. 1, the rising edge of the input clock signal sets the output of clock generator 12 (on line CORECLK) to a high level. Clock generator 12 resets low its output on line CORECLK responsive to receiving the rising edge of the input clock signal, delayed by the time delay set within programmable delay stage 14. The delay period of programmable delay stage 14 is preferably selected to slightly exceed the time required for the worst case clock phase in the instruction set or possible operations of core unit 4. As such, clock generator 12 uses edge triggered set and reset functions based on the input clock signal, and provides an internal clock signal on line CORECLK that is at the same frequency as the input clock signal at terminal CLKIN, at a fixed phase duration so that variations in the duty cycle of the input clock signal thus do not affect the duty cycle of the internal clock signal on line CORECLK. In the preferred embodiment of the invention, the delay period is selected according to the propagation delay of the worst case logic path, thus ensuring proper operation of integrated circuit 2 regardless of the duty cycle of the input clock signal, and thus over a wide range of duty cycle timing specifications.

Meanwhile, frequency divider 10 is generating a clock signal on line BUSCLK that is at half the frequency of the input clock signal at terminal CLKIN. Accordingly, the operation of bus interface unit 6 can be controlled in a manner consistent with externally connected integrated circuits, while still allowing the operation of core unit 4 to perform at the highest practicable clock rate.

Figure 2:
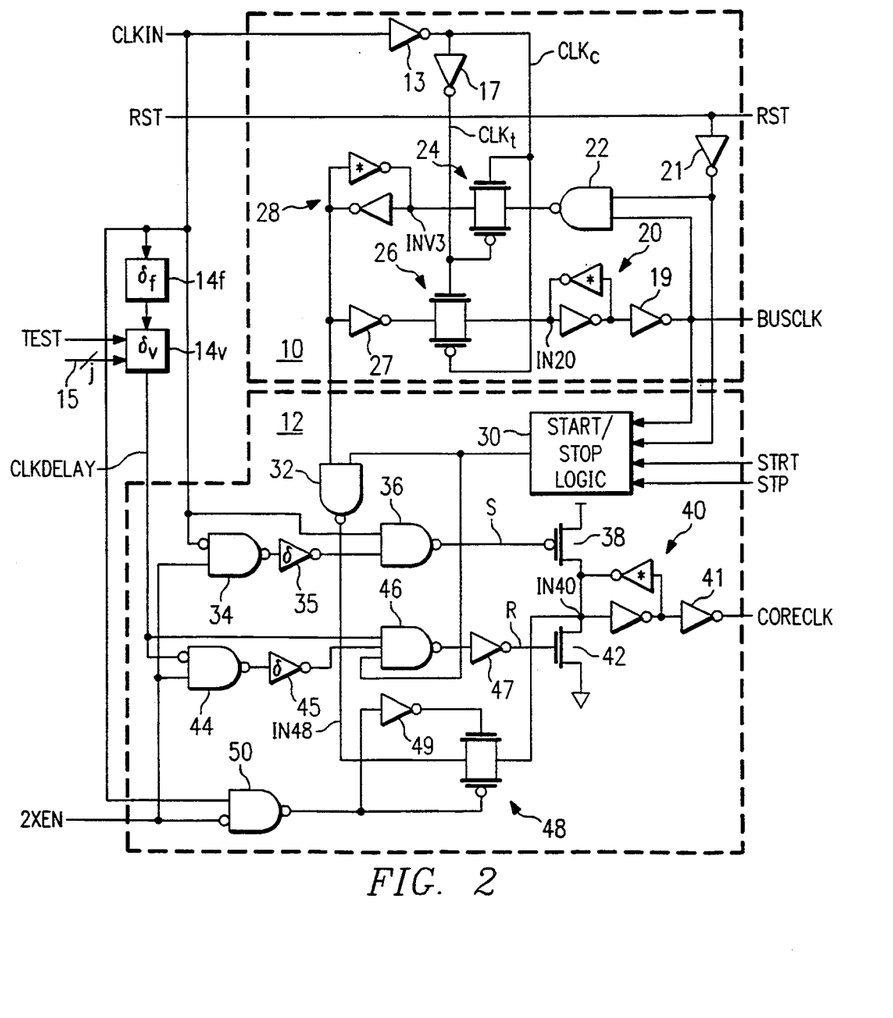
FIG. 2 is an electrical diagram, in schematic form, of the clock generator circuit according to the preferred embodiment of the invention.

Referring now to FIG. 2, the construction of frequency divider 10 and clock generator 12 according to the preferred embodiment of the invention will now be described in detail.

Frequency divider 10 in this example of the invention is of substantially conventional design, and includes a reset function by which its output may be suspended. Line CLKIN communicates the input clock signal (after buffering if desired) to inverters 13 and 17, which generate complement and true clock signals on lines CLKc and CLKt, respectively. Each of pass gates 24, 26 consist of complementary MOS transistors having their source/drain paths connected in parallel with one another, and having their gates connected to complementary lines CLKt, CLKc so as to be simultaneously on or off.

Line RST communicates a reset signal from elsewhere in integrated circuit 2 to an input of NAND gate 22 in frequency divider 10 and to start/stop logic 30 in clock generator 12. Line RST is preferably buffered within integrated circuit 2, in the conventional manner, to eliminate false resets due to noise, and to ensure proper phase synchronization after reset. The second input of NAND gate 22 is connected to the output of frequency divider 10 on line BUSCLK. During non-reset modes, the low logic level on line RST presents a high logic level (via inverter 21) to one input of NAND gate 22, allowing the state of line BUSCLK to control the output of NAND gate 22.

The output of NAND gate 22 is connected to one side of pass gate 24. The other side of pass gate 24 is received by latch 28 and communicated to one side of pass gate 26 (after inversion by inverter 27 to account for the inversion by latch 28). Latch 28, in this example and elsewhere within this embodiment of the invention, consists of a pair of cross-coupled inverters where the feedback inverter has significantly weaker drive than the feed-forward inverter so that it can be rapidly overwritten as a new logic level is received at its input; this weaker drive is illustrated in FIG. 2 by an asterisk in the feedback inverter of latch 28 (and in other latches in FIGS. 2 and 3).

In this example, pass gate 24 is operable to pass the state of the output of NAND 22 to latch 28 during the low level phase of the input clock signal on line CLKIN. Accordingly, if line RST is low during this phase, the logical complement of the state of line BUSCLK is communicated to latch 28 during low phases of the input clock signal. After inversion by inverter 27, the state of latch 28 is communicated to pass gate 26.

Pass gate 26 has its other side connected to latch 20 which, via inverter 19, drives line BUSCLK. In this example, pass gate 26 has its gates controlled by lines CLKt, CLKc in a complementary manner relative to pass gate 24, such that pass gate 26 is conductive during high level phases of the input clock signal at line CLKIN. Accordingly, the complement of the state of line BUSCLK thus requires both a low level phase and a high level phase to be communicated back to latch 20, for presentation (after inversion by inverter 19) on line BUSCLK as a logic level transition of this output clock. As such, the frequency at which line BUSCLK toggles will be exactly one-half that of the input clock signal at line CLKIN.

As noted above, when line RST is at a low logic level, NAND gate 22 is operable to respond to the state of line BUSCLK; conversely, in a reset or suspend operation, where line RST is at a high logic level, the output of NAND gate 22 is forced high regardless of the state of line BUSCLK. Accordingly, the state of line BUSCLK is held high during the reset condition.

Start/stop logic receives line RST (via inverter 21), line BUSCLK, and start and stop signals on lines STRT and STP, respectively. Start/stop logic 30 includes such combinational logic as required to enable and disable clock generator 12 according to the reset condition on line RST, and according to the start and stop signals. The start and stop signals allow for suspension of the output clock signal on line CORECLK, as will be described hereinbelow.

The input clock signal at line CLKIN is communicated to an inverting input of NAND gate 34 and to a non-inverting input of NAND gate 36. The second input of NAND gate 34 receives line 2XEN which enables clock doubling with a high logic level. The output of NAND gate 34 is communicated, via inverting delay stage 35, to the second input of NAND gate 36. Delay stage 35 may consist of several inverters in series, of a conventional single delay stage, or other conventional delay circuits for delaying the propagation of the signal from the output of NAND gate 34 to the input of NAND gate 36 for a selected time. As a result, NAND gate 36 will present a low logic level pulse responsive to the rising edge of the input clock signal at line CLKIN, and having a pulse width corresponding to the propagation delay of NAND gate 34 and delay stage 35. The output of NAND gate 36 is connected to the gate of a p-channel transistor having its source-drain path connected between $V_{cc}$ and the input of latch 40; the output of latch 40 drives line CORECLK via inverter 41.

The input clock signal on line CLKIN is also connected to fixed delay stage 14$f$ and variable delay stage 14$v$, connected in series. In this example, and as will be described in further detail hereinbelow, variable delay stage 14v receives inputs on line TEST and on j select lines 15j, as shown in FIG. 1. The output of variable delay stage 14v on line CLKDELAY is connected to a non-inverting input of NAND gate 46 and to an inverting input of NAND gate 44. The second input of NAND gate 44 receives line 2XEN. As in the above-described case, the output of NAND gate 44 is connected to a second input of NAND gate 46 via inverting delay stage 45. As a result, the output of NAND gate 46 will present a low logic level pulse responsive to the rising edge of the signal on line CLKDELAY from variable delay stage 14v, having a pulse width defined by the delay through NAND gate 44 and delay stage 45. The output of NAND gate 46 is connected, after inversion by inverter 47, to the gate of an n-channel transistor 42 having its source/drain path connected between the input of latch 40 and ground.

NAND gate 46 also receives an input from the output of start/stop logic 30, thus allowing the reset signal on line RST, and the start and stop signals on lines STRT and STP, to control the operation of clock generator 12 in the clock doubling mode. For example, if start/stop logic 30 drives a low logic level at its output, the output of NAND gate 46 will be forced high, ensuring that n-channel transistor 42 does not turn on. In such an event, latch 40 cannot be overwritten with a low level, thus disabling transitions of the clock signal on line CORECLK.

Line 2XEN is also connected to an inverting input of NAND gate 50, which receives the input clock signal on line CLKIN at its other input. The output of NAND gate 50 is connected to pass gate 48 in complementary fashion (via inverter 49); as such, pass gate 48 is made non-conductive when line 2XEN is high, during the clock doubling mode.

Clock generator 12 according to this example also can provide a half-frequency clock signal on line CORECLK during the non-clock doubling mode indicated by line 2XEN being at a low logic level. NAND gate 32 receives the output of latch 28 in frequency divider 10 at one input, and receives the output of start/stop logic 30 at the other input. Start/stop logic 30 is therefore able to gate the application of the output of latch 28 to the frequency divider portion of clock generator 12, such as is useful in suspending its operation (as in the case of line RST being high for frequency divider 10) and restarting it in a synchronous manner.

The output of NAND gate 32 is presented to one side of pass gate 48. The opposite side of pass gate 48 is coupled to the input of latch 40. Considering the effect of NAND gate 50 and inverter 49, the n-channel transistor in pass gate 48 receives a signal corresponding to the input clock signal on line CLKIN, and the p-channel transistor in pass gate 48 receives a signal corresponding to the logical complement of the input clock signal on line CLKIN; as such, pass gate 48 is gated similarly as pass gate 26 in frequency divider 10. As a result, in non-clock doubling mode, clock generator 12 is configured similarly as frequency divider 10 (with the two circuits sharing the first portion thereof of NAND gate 22, pass gate 24 and latch 28), for generating a half-frequency clock on line CORECLK. In this mode, therefore, the frequency of the clock signal on lines CORECLK and BUSCLK are identical.

Figure 4A:
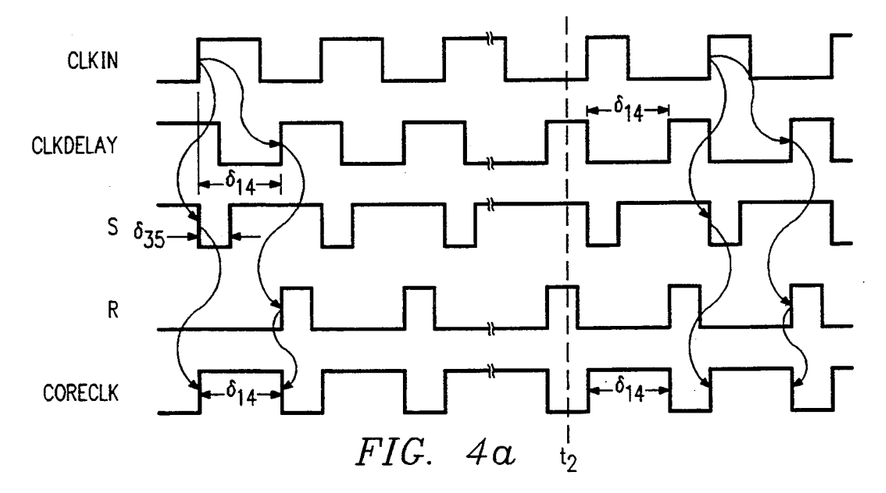
FIGS. 4a and 4b are timing diagrams illustrating the operation of the clock generator circuit according to the preferred embodiment of the invention.

FIG. 4a illustrates the operation of clock generator 12 in clock doubling mode, selected by line 2XEN being at a high logic level. For purposes of clarity of description, small propagation delays and charging transients are not shown in FIG. 4a. In this mode a rising edge on line CLKIN first causes the output of NAND gate 36 (node S in FIG. 4a) to go to a low logic level. This low logic level at the output of NAND gate 36 continues until the rising edge propagates through NAND gate 34 and delay stage 35; this propagation delay is shown in FIG. 4a as $\delta_{35}$, and defines the pulse width of the low logic level at node S. Responsive to node S being low, transistor 38 turns on, charging the input of latch 40 high which, via inverter 41, drives line CORECLK high. Accordingly, in clock doubling mode the rising edge of the input clock signal operates to set the output of clock generator circuit 12 on line CORECLK.

The rising edge of the input clock signal at line CLKIN also propagates through delay stages 14f, 14v, appearing at line CLKDELAY after the delay period $\delta_{14}$ (i.e., the propagation delay through delay stages 14f, 14v). At such time as the rising edge of the input clock signal appears on line CLKDELAY, the output of NAND gate 46 goes to a low logic level (the other inputs to NAND gate 46 being high). The low logic level at the output of NAND gate 46, via inverter 47, drives the gate of n-channel transistor 42 (node R of FIGS. 2 and 4a) high, turning on transistor 42 and discharging the input of latch 40 to ground. Latch 40 and inverter 41, in turn, drive line CORECLK low in response to transistor 42 being turned on. Accordingly, the rising edge of the signal on line CLKDELAY operates to reset the output of clock generator 12 on line CORECLK to a low level, delayed from the high level transition by the delay time $\delta_{14}$ of programmable delay stage 14.

It should be apparent to one of ordinary skill in the art that the duration of the pulse width of the low logic level pulse at node S (i.e., the time delay $\delta_{35}$) and the duration of the high logic level pulse at node R (i.e., the time delay $\delta_{45}$) should be selected to ensure that the input to latch 40 is fully charged and discharged, respectively, in each cycle. However, these delays should also be selected to prevent the set and reset pulses from overlapping, as such would cause a crowbar condition (i.e., direct short from $V_{cc}$ to ground) through transistors 38 and 42.

As a result of the operation of clock generator 12, a clock signal is generated on line CORECLK which is at the same frequency as the input clock signal, but which has a duty cycle independent from that of the input clock signal. This is because the duration of one of the phases of the clock on line CORECLK is dependent upon the time between the set and reset pulses (at low and high levels, respectively, in this example). According to this embodiment of the invention, the time between the set and reset pulses depends solely upon the delay period $\delta_{14}$ through programmable delay 14 (i.e., through delay stages 14f, 14v), and does not depend upon the duty cycle of the input clock signal on line CLKIN. Indeed, in the example of FIG. 4a, it should be noted that the duration of the high level phase on line CORECLK is greater than that of the input clock signal on line CLKIN. As will be discussed in further detail hereinbelow, this allows the duty cycle of the internal high frequency clock on line CORECLK to be optimized for the worst case phase, rather than for an average which is dependent upon the input clock signal.

This independence of the duty cycle of the clock signal on line CORECLK is further evident from the later cycles (after time $t_2$) shown in FIG. 4a. In these cycles, the duty cycle of the input clock signal on line CLKIN after time $t_2$ has become shorter than in the previous cycles illustrated in FIG. 4a, to approximately half that of the desired duration on line CORECLK. As in the prior cycles, however, the rising edge of the signal on line CLKIN causes a low logic level pulse at node S which, in turn, drives line CORECLK high. After expiration of the delay period $\delta_{14}$ after this edge, line CLKDELAY presents a rising edge which causes node R to be driven high, driving line CORECLK low. As a result, the duty cycle of the clock signal on line CORECLK remains constant, as determined by the delay time $\delta_{14}$ of programmable delay stage 14, and is thus independent of the duty cycle of the input clock signal on line CLKIN.

This construction of clock generator 12 thus provides a high degree of stability in the generation of a high frequency internal clock based on a received high frequency input clock signal. Particularly as microprocessor clock frequencies increase to 25 MHz and beyond, the generation and presentation of external clock signals of high quality and stability becomes more difficult, especially considering ringing and other noise effects which become more pronounced with higher switching speeds. Since clock generator 12 according to this embodiment of the invention generates its clock signals based on edges of the input clock signal, and on internal delays, the clock signal on line CORECLK is not strongly affected by noise and other instabilities in the input clock signal.

Figure 4B:
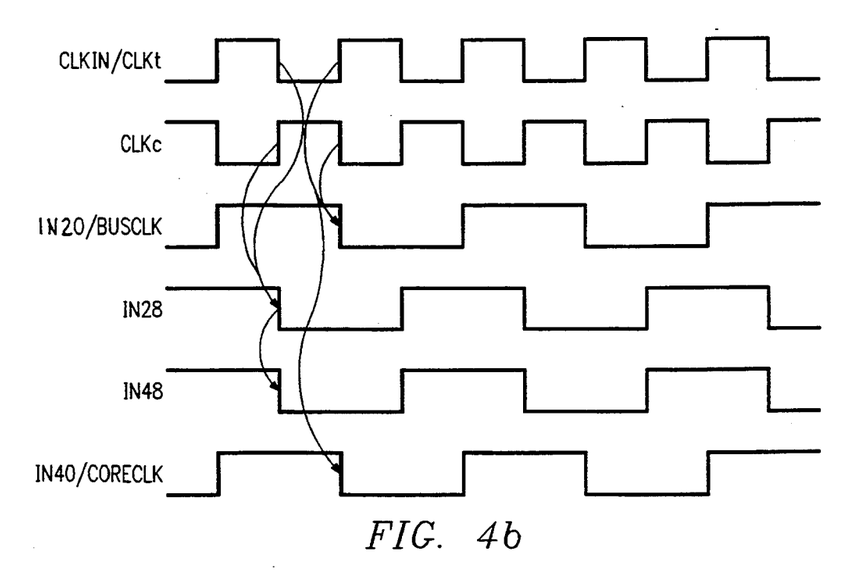

Referring next to FIG. 4b, the operation of clock generator 12 in the non-clock doubling mode, indicated by line 2XEN being at a low logic level, will now be described. With line 2XEN at a low logic level, the outputs of NAND gates 34 and 44 are both forced high, causing transistors 38 and 42 to both be held in the off condition in this mode. The low logic level on line 2XEN also enables NAND gate 50 to respond to the input clock signal on line CLKIN, so that pass gate 48 receives complementary gating signals corresponding to line CLKIN.

The cycles illustrated in FIG. 4b begin with the initial condition of line BUSCLK (and thus node IN20 at the input of latch 20) at a high logic level, and line CORECLK (and thus node IN40 at the input of latch 40) at a high logic level. Upon the falling edge of line CLKIN (corresponding to a rising edge on line CLKc and a falling edge on line CLKt), pass gate 24 is made conductive, communicating the state of line BUSCLK, inverted by NAND 22, as a low logic level to node IN28 at the input to latch 28. This low logic level is also communicated via NAND gate 32 (the output of start-/stop logic 30 being high to enable operation) as a low level (inverted twice by latch 28 and NAND gate 32) to node IN48 at the input to pass gate 48. Pass gates 26 and 48 are non-conductive during this phase of the input clock signal, as they are gated in a complementary fashion relative to pass gate 24.

Upon the rising edge of the input clock signal, pass gates 26 and 48 become conductive and pass gate 24 turns off. Latch 28 retains its low logic level input at this time due to the operation of its feedback inverter. With pass gate 26 conductive, the state of node IN28 is communicated (after inversion by latch 28 and by inverter 27) to node IN20 at the input of latch 20, thus presenting a low logic level on line BUSCLK. Similarly, with pass gate 48 conductive, the low logic level at node IN48 is communicated to the input of latch 40 (node IN40), and presented on line CORECLK.

This operation of frequency divider 10 and clock generator 12 in the non-clock doubling mode continues, with the alternating state of line BUSCLK fed back through NAND gate 22 into frequency divider 10. As a result, in this mode the frequencies of the signals on lines BUSCLK and CORECLK are equal to each other, at half the frequency of the input clock signal frequency at line CLKIN.

As noted hereinabove relative to FIG. 4a, the propagation delays through this circuit are not illustrated in FIG. 4b, for clarity of description. However, for purposes of stability, it may be preferable to insert delay stages, such as inverter chains, at certain locations in the circuit, thus ensuring that a logic transition is not occurring at the input to a pass gate at the same time as the pass gate turns off. For example, inverter 27 may be replaced by a series of inverters, with propagation delay therethrough as desired.

In addition, clock generator 12 may be readily configured to provide a complementary clock signal to the signal on line CORECLK, for example by providing a similar circuit to that of latch 40 and transistors 38, 42, 48, but which operates in complementary fashion. It is contemplated that other clock signals may be generated from those signals shown in FIG. 2 by the addition of such elementary logic as would be known by one of ordinary skill in the art having reference to this description.

According to this embodiment of the invention, the ability of clock control circuit 8 to selectably operate in either the clock doubling mode or non-clock doubling mode, depending upon the state of line 2XEN, provides significant advantages in the design and operation of integrated circuit 2 over prior techniques. According to prior techniques, a control signal selected, for certain integrated circuit functions (such as the core unit and the bus interface unit), which of the clock signals was to control their operation; as such, the functional circuitry necessarily required relatively complex circuitry to implement this ability to respond to a selected clock signal, with such circuitry necessarily affecting the most critical timing path of the high frequency internal clocks. According to the present invention, however, the ability of clock control circuit 8 to generate output clock signals in a selected mode allows the functional circuitry, such as core unit 4, to be designed so that it need only respond to a single internal clock signal, as the determination of the core clock frequency is made by clock control circuit 8.

As noted above, the selection of which clock mode is made, in this example, by the bonding of pad 2XEN to a power supply or ground pad. This method of selecting the clock mode is especially beneficial to the manufacturer, as only a single type of integrated circuit 2 need be fabricated in order to provide inventory for both types of products (clock doubled or not), as the selection of the operation mode need not be made at the initial wafer fabrication stage, but instead is determined in the packaging operation. Furthermore, the user of integrated circuit 2 according to this embodiment of the invention is not required to make any provision, such as externally connecting a terminal high or low, in order to maintain the proper desired operating mode.

Referring back to the clock doubling mode of FIG. 4a, clock generator 12 according to the present invention thus generates an internal clock signal having a duty cycle which depends upon a delay time $\delta_{14}$ through programmable delay stage 14. In modern high complexity integrated circuits such as microprocessors and math co-processors, one of the two clock phases will control the worst case logic propagation path, such that the duration of the worst case phase will be critical in the operation of the circuit (i.e., if the duration of this worst case clock phase is too short, the circuit will malfunction). According to the preferred embodiment of the invention, and as shown in FIG. 2, programmable delay stage 14 preferably includes a fixed delay stage 14f and a variable delay stage 14v, such that the delay time $\delta_{14}$, and thus the duration of the worst case clock phase, may be set or altered either during characterization, production test or in operation.

In setting delay time $\delta_{14}$, the circuit designer should consider, by way of modeling or other characterization, the worst case high speed logic path in core unit 4 for a possible instruction or logic operation, and add to the time required for this worst case path ($t_d$) a certain safety margin time ($t_m$) to arrive at a minimum clock phase duration ($t_h = t_d + t_m$), which will correspond to the delay time $\delta_{14}$. In order to ensure compliance over the full specification range of the circuit, it would be preferable that the ratio $t_d/t_h$ remain substantially constant over voltage, temperature, and processing conditions. In particular, it is desirable that integrated circuits such as microprocessors, math co-processors and the like be able to operate over a wide voltage range, including not only traditional levels of the $V_{cc}$ power supply voltage (i.e., nominally 5 volts) but also the lower $V_{cc}$ levels (i.e., nominally 3.3 volts) that are expected to be necessary for modern integrated circuits having sub-micron physical features.

Figure 3:
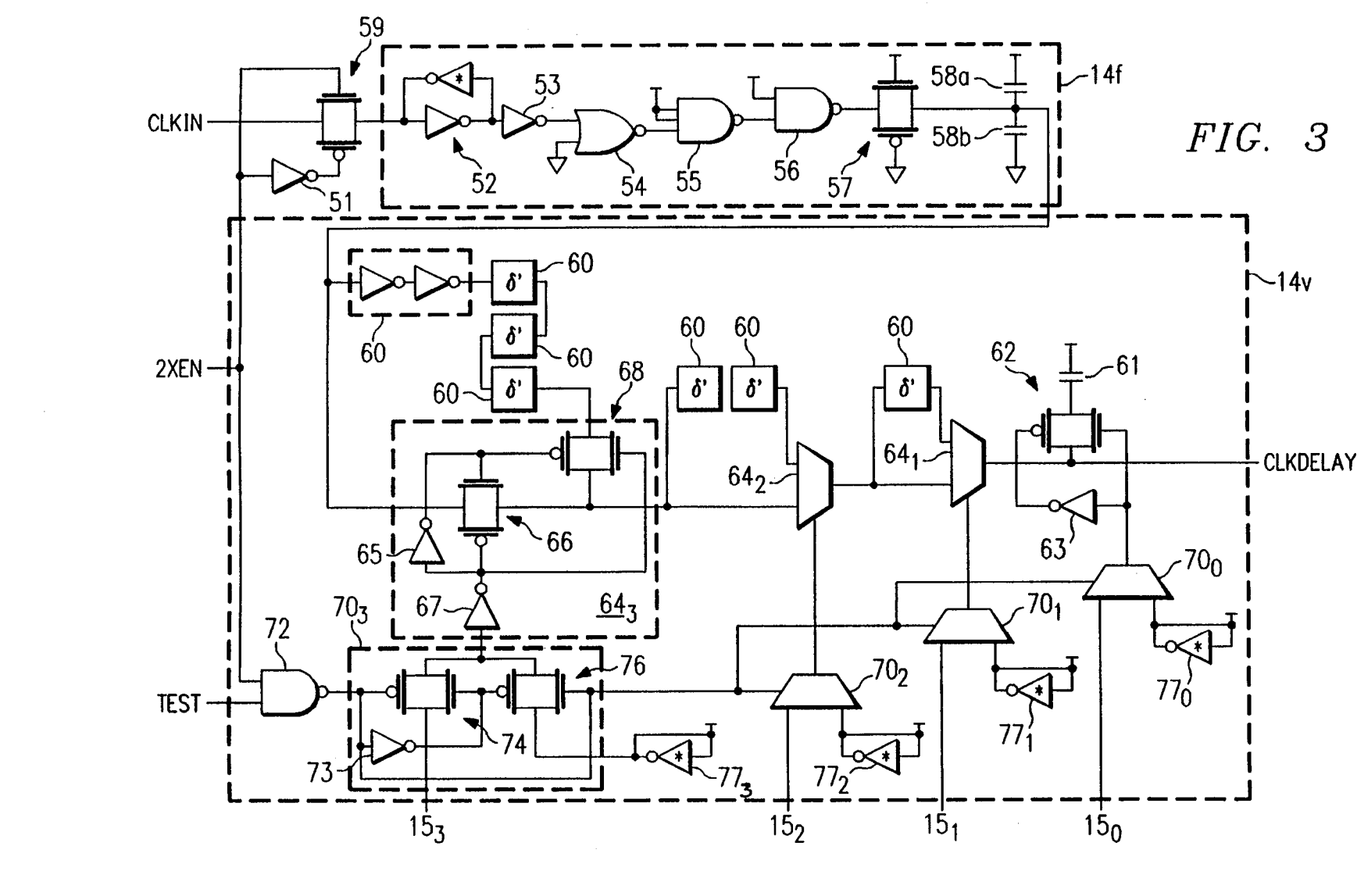
FIG. 3 is an electrical diagram, in schematic form, of the delay stage in the clock generator circuit of FIG. 2.

Referring now to FIG. 3, the construction of programmable delay stage 14 according to the preferred embodiment of the invention will now be described. This construction of programmable delay stage 14 includes such features as to provide a delay time $\delta_{14}$ that matches variations in voltage, temperature and processing which affect the minimum clock phase duration time $t_h$, and to provide the ability to readily change the delay time $\delta_{14}$ as necessary.

Fixed delay stage 14f receives the input clock signal on line CLKIN via pass gate 59, controlled in complementary fashion by the signal on line 2XEN. In non-clock doubling mode (since the clock signal on line CLKDELAY is not used; see FIGS. 3 and 4b) with line 2XEN low, pass gate 59 is non-conductive; during clock doubling mode, pass gate 59 remains conductive. Fixed delay stage 14f, according to this embodiment of the invention, includes multiple delay elements of various logic types, selected according to the worst case propagation delay in core unit 4 or elsewhere in circuit 2. The use of multiple types of delay elements, rather than many delay elements of the same type (e.g., a string of inverters), provides a high degree of matching of the delay through fixed delay stage 14f to variations of the worst case logic path resulting from changes in temperature, processing, and bias voltage, thus accounting for variations in the propagation delay among various types of circuit elements as a function of voltage, temperature, and process parameters. In this embodiment of the invention, fixed delay stage 14f includes latch 52, inverter 53, NOR gate 54 (with another input tied to ground), three-input NAND gate 55 (with its two other inputs tied high), two-input NAND gate 56 (with its other input tied high), pass gate 57 (biased on), and capacitors 58a, 58b biased to $V_{cc}$ and ground, respectively. Capacitors 58a, 58b represent parasitic capacitances in core unit 4, and may be implemented as separate capacitors in fixed delay stage 14f, or by way of parasitic capacitances therein. While one of each type of delay element is illustrated in FIG. 3, fixed delay stage 14f may include multiple ones of these elements, multiple chains of elements, or such other elements and combinations as useful to mimic the worst case core unit 4 delay path.

Variable delay stage 14v, according to this embodiment of the invention, receives the output of fixed delay stage 14f, and adds a selectable amount of delay thereto, prior to presenting the result at its output on line CLKDELAY. Variable delay stage 14v in this embodiment of the invention can select various delays in a special test mode, with a default delay set by way of metal mask options. In addition, as will be evident from the following description, the selection of the delay through variable delay stage 14v may be made in substantially equal increments by a binary code, thus allowing great flexibility in the selection of the overall delay time $\delta_{14}$.

In this example, variable delay stage 14v includes four individually selectable delay paths. The most significant delay path is a set of four inverter pairs 60 selectable by multiplexer $64_3$. Similarly, the next most significant delay path has two inverter pairs 60 selectable by multiplexer $64_2$; with the next most significant delay path having one inverter pair 60 selectable by multiplexer $64_1$. Each of the inverter pairs 60 preferably has the same propagation delay therethrough (i.e., delay $\delta'$). The least significant delay path is implemented by the connection of capacitor 61 by pass gate 62, adding a capacitive load which preferably matches one-half the delay $\delta'$ of an inverter pair 60, or the propagation delay of a single inverter. Accordingly, the delay time through variable delay stage 14v may be selected in a binary fashion, as the four selectable paths are weighted in a binary fashion ($2^3$, $2^2$, $2^1$ and $2^0$ inverters, respectively).

Multiplexers 64 (and pass gate 62) cause the series path of the clock signal from fixed delay stage 14f to either pass through associated delay elements, or pass directly to the next stage without being delayed, responsive to the control input applied thereto from multiplexers $70_3$ through $70_0$, respectively. Each of multiplexers $64_3$, $64_2$, $64_1$, may be constructed as shown in FIG. 3 for multiplexer $64_3$. In this example, the source/drain path of pass gate 66 is connected between the incoming clock signal and the input to the next stage, while pass gate 68 has its source/drain path connected between the output of the final delay element 60 and the input to the next stage. Pass gates 66, 68 in each multiplexer 64 are gated in complementary fashion by the control signal from its associated multiplexer 70, via inverters 65, 67, so that one is on while the other is off. As such, the output of multiplexer 70 will control whether the delayed version or the non-delayed version of the incoming clock signal from fixed delay stage 14f (or from the prior multiplexer 64) is applied to the input of the next stage in variable delay stage 14v. The least significant delay stage of capacitor 61 is selected by the combination of a pass gate 62 having its source/drain path connected between capacitor 61 and line CLKDELAY, and having its gates controlled in complementary fashion by the output of multiplexer $70_0$.

Multiplexers 70 select between the value of a test signal input on an associated select line 15 or a default value, in communicating to multiplexer 64 (or pass gate 62) whether or not its associated delay value is to be included; multiplexers 70 are controlled by a signal indicating whether or not test mode is enabled. A default value is presented to each of multiplexers 70 by way of an associated weak inverter 77 having both its input and its output tied to a fixed voltage. For example, FIG. 3 shows the inputs and outputs of each inverter 77 tied to $V_{cc}$, in which case inverters 77 will each drive a high voltage at their output. This state of each inverter 77 can be altered by opening the connection between its output and the fixed voltage by way of a metal mask, fuse, laser cut, or the like, allowing inverter 77 to drive its output to the opposite state. In the alternative, the default condition may be set by an electrically programmable element, a register bit, by software, or other conventional techniques.

Each multiplexer 70, in this example, receives a select line 15 at one input, the output of inverter 77 at another input, and the output of NAND gate 72 as the control input. NAND gate 72 receives line 2XEN at one input and line TEST at its other input. The output of NAND gate 72 is connected to the gates of a first pass gate 74 in complementary fashion (via inverter 73), and to the gates of a second pass gate 76 in a manner complementary to its connection to pass gate 74; as such, either pass gate 74 or pass gate 76 will be made conductive, depending upon the state of the output of NAND gate 72. The output of NAND gate 22 is also fed directly to the control input of the next multiplexer 70 in line. With the output of NAND gate 72 low, pass gate 74 will be conductive and connects select line 15 to the control input of multiplexer 64 (or to pass gate 62 in the case of multiplexer $70_o$); a high output from NAND gate 72 will make pass gate 76 conductive, connecting the output of inverter 77 to the control input of multiplexer 64 (or pass gate 62 in the case of multiplexer $70_o$).

In operation, in a non-clock doubling mode (line 2XEN low), the outputs of inverters 77 are selected by all multiplexers 70, presenting the default delay value, preventing metastable or indeterminate conditions in variable delay stage 14v. In clock doubling mode, the state of line TEST (at the other input of NAND gate 72) will control multiplexers 70. In a non-test mode, or normal operating mode, the output of the array of inverters 77 will determine the delay presented by variable delay stage 14v, ranging from no delay up to the propagation delay of fifteen inverters, selectable in single inverter (i.e., capacitor 61) increments in binary fashion by the four inverters 77.

In test mode, the state of select lines 15 will determine the delay through variable delay stage 14v, in a binary fashion by the state of the four select lines 15j. Test mode may be enabled by any one of the known techniques in the integrated circuit art, including the provision of a dedicated test mode terminal or pad, an overvoltage condition on one of the normal input terminals to the circuit, a special code executed by circuit 2, or other known techniques. With line TEST high, pass gates 74 in multiplexers 70 will all be on, allowing the state of select lines 15 to determine the variable delay length. Accordingly, in this mode, one may operate circuit 2 with varying delay times $\delta_{14}$ to determine the shortest delay time $\delta_{14}$, and thus the minimum clock phase duration ($t_h$) for which circuit 2 can still successfully operate under a given voltage or temperature condition.

It is contemplated that the provision of variable delay stage 14v, and its use during a test mode, will be of benefit primarily to the production and design engineers of a particular integrated circuit 2. This is because initial prototype samples may be characterized in test mode to determine a minimum, yet safe, delay time $\delta_{14}$ for varying operating conditions and functions, thus allowing selection of the proper default value by opening the appropriate lines at the output of inverters 77 in variable delay stage 14v. Furthermore, the use of the test mode can allow for periodic measurement of the minimum delay time $\delta_{14}$ as the circuit 2 is being produced, and accordingly for modification of the metallization mask setting the states of inverters 77 over time.

This construction of variable delay stage 14v may also be used, if desired, to individually set the state of inverter 77 for each functional circuit, for example by opening a polysilicon fuse at the output of each inverter 77 by way of a laser or an avalanche condition. Further in the alternative, the manufacturer of the circuit may be able to select the proper metal mask in process, based upon threshold voltages, channel lengths and other measurable parameters during the fabrication of circuit 2. Of course, multiplexers 70 may further alternatively be responsive to a register location, such that the propagation delay through variable delay stage 14v can be set by software.

As a result of the preferred embodiment of the invention, therefore, the duration of the worst case clock phase depends upon a fixed value, closely matching variations in voltage, temperature and processing, plus a variable amount that can be readily selected. Accordingly, the present invention provides for the generation of a high frequency (twice the bus clock frequency) internal clock generated from an external input clock signal which may have unstable duty cycle, and also the ability to tune and select the duty cycle of the internal clock so as to match variations in temperature and processing conditions. In particular, the internal clock so generated can be sufficiently stable relative to changes in the power supply voltages so as to enable the design and manufacture of high speed, high complexity logic circuits such as microprocessors, math co-processors and the like that can operate both at conventional (5 volt) power supply voltages as well as at low (3.3 volt) power supply voltages.

The above-described embodiment of the invention is directed to the internal clock distribution system which generates a half-frequency clock for bus interface operations (line BUSCLK) and a high speed clock for core unit operations (line CORECLK) that is at the same frequency as the input clock signal. Of course, by including conventional frequency multipliers and other frequency synthesizer circuits, one may generate internal clock signals of higher or lower frequencies than that of the input clock signal. It is contemplated that one of ordinary skill in the art, having reference to this specification and the drawings, will be readily able to utilize the benefits of the present invention in such applications.

Figures 5, 6:
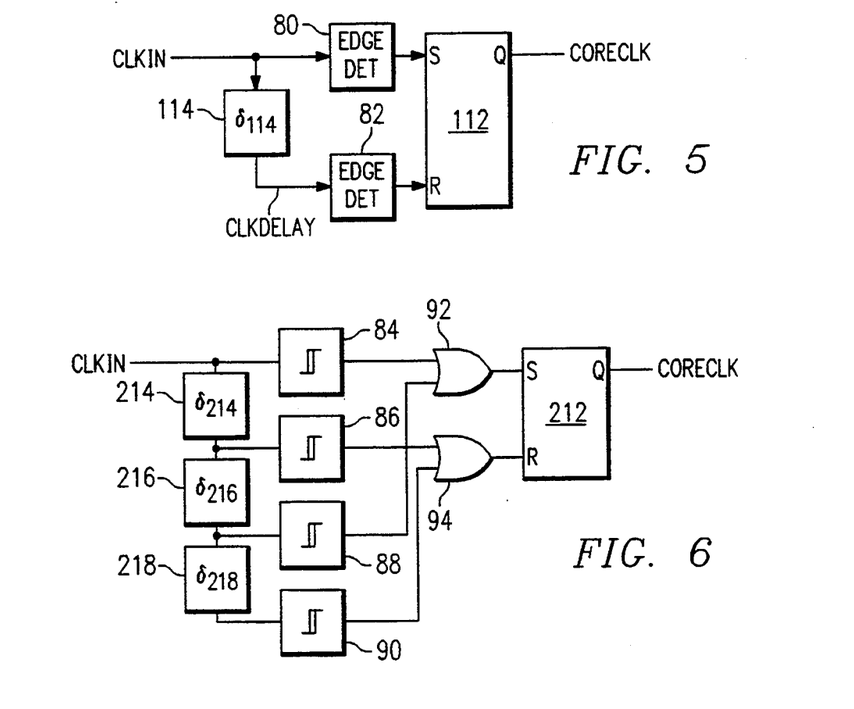
FIG. 5 is an electrical diagram, in block form, of a clock generator circuit according to a first alternative embodiment of the invention.
FIG. 6 is an electrical diagram, in block form, of a clock generator circuit according to a second alternative embodiment of the invention.

Referring now to FIG. 5, an exemplary embodiment of the invention is illustrated in block form in which an internal clock signal is generated on line CORECLK at twice the frequency of the input clock signal. In this embodiment, the input clock signal on line CLKIN is communicated to edge detector circuit 80, which generates a rising edge at its output to the set input of clock generator 112 responsive to either a rising or falling edge on line CLKIN. Line CLKIN is also connected to programmable delay stage 114, constructed similarly as programmable delay stage 14 described hereinabove. The output of programmable delay stage 114 on line CLKDELAY is connected to edge detector 82, which detects either a rising or falling edge at its input and generates a rising edge at its output responsive to either a rising or falling edge on line CLKDELAY. The output of edge detector 82 is connected to the reset input of clock generator 112. Clock generator 112 is constructed similarly as clock generator circuit 12 described hereinabove.

In operation, each transition of the input clock signal on line CLKIN is detected by edge detector 80, which applies a pulse at the set input of clock generator 112 and, in this case, drives high the Q output of clock generator 112 at line CORECLK. After elapse of the delay period $\delta_{114}$, the input clock transition will appear on line CLKDELAY and will be detected by edge detector 82 which, in turn, applies a pulse to the reset input of clock generator circuit 112. The reset signal will drive line CORECLK at the Q output of clock generator circuit 112 to a low logic level. Accordingly, since each transition (rising or falling) causes both a set pulse and a reset pulse to be applied to clock generator 112, the frequency at the output of clock generator 112 will be at twice the frequency of the input clock signal.

Referring now to FIG. 6, the construction of a clock multiplier arrangement according to another alternative embodiment of the invention will now be described. In the arrangement of FIG. 6, the frequency of the clock signal on line CORECLK is again multiplied from that on line CLKIN; in this example, the frequency is doubled. Line CLKIN is received by rising edge detector 84, constructed similarly as NAND gates 34, 36 and delay stage 35 in clock generator 12 shown in FIG. 2, to provide a pulse responsive to a rising edge of the signal on line CLKIN; in contrast to the arrangement of FIG. 5, no pulse is generated by rising edge detector 84 responsive to a falling edge on line CLKIN. The output of rising edge detector 84 is connected to a first input of OR gate 92.

Line CLKIN is also connected to a series of delay stages 214, 216, 218, each of which has a separate delay period (although one or more may have the same delay period, if desired). Delay stages 214, 216, 218 preferably include fixed and variable portions, as described hereinabove relative to programmable delay stage 14. The output of delay stage 214 is connected to rising edge detector 86, which in turn has its output connected to one input of OR gate 94. The output of delay stage 216 is connected to rising edge detector 88, which has its output connected to a second input of OR gate 92. Similarly, the output of delay stage 218 is connected to the input of rising edge detector 90, which has its output connected to a second input of OR gate 94.

OR gate 92 drives the set input of clock generator 212 with its output, while OR gate 94 drives the reset input of clock generator 212 with its output. Clock generator 212 may be constructed similarly as clock generators 12 and 112 described hereinabove. Accordingly, clock generator 12 presents a high logic level at its Q output, on line CORECLK, responsive to a pulse at its set input, and resets its Q output to a low logic level responsive to a pulse at its reset input.

Figure 7:
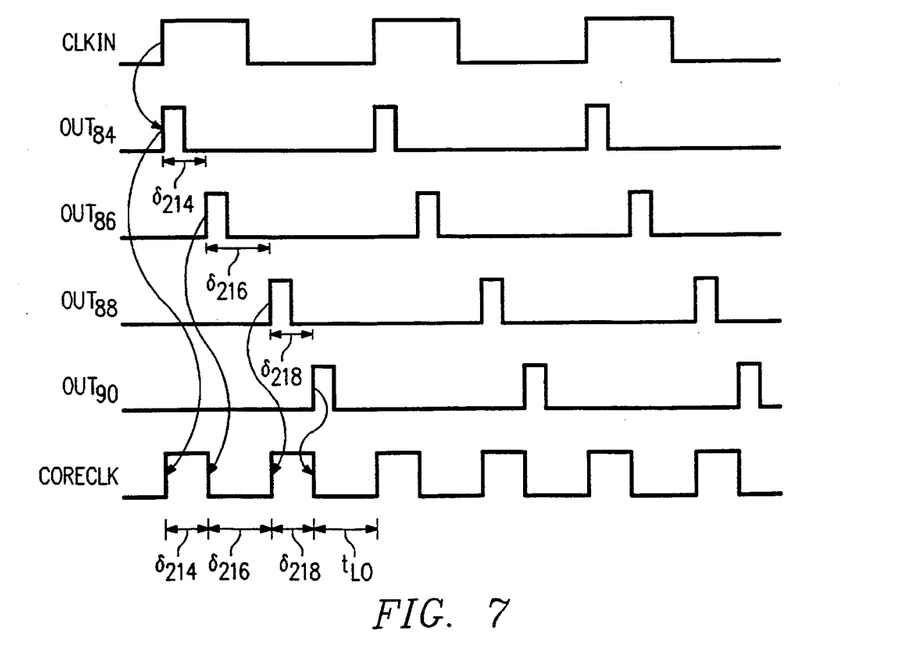
FIG. 7 is a timing diagram illustrating the operation of the circuit of FIG. 6.

According to the embodiment of FIG. 6, therefore, the clock signal on line CORECLK is at twice the frequency of the input clock signal on line CLKIN, with the delay periods $\delta_{214}$, $\delta_{216}$, $\delta_{218}$ determining the duration of three successive phases in two cycles; the fourth phase in the second cycle is determined by the difference between the period of the input clock signal on line CLKIN and the sum of the delay periods $\delta_{214}$, $\delta_{216}$, $\delta_{218}$. Referring now to FIG. 7, the operation of the arrangement of FIG. 6 will now be described. As in the above cases, small propagation delays are not shown, for purposes of clarity.

In FIG. 7, the rising edge of line CLKIN is detected by rising edge detector 84, which presents a high level pulse (OUT$_{84}$ in FIG. 7) to an input of OR gate 92 and thus to the set input of clock generator 212. Accordingly, this rising edge of line CLKIN initiates a rising edge of the clock signal on line CORECLK. After delay period $\delta_{214}$ has elapsed from the rising edge on line CLKIN, a rising edge is presented to rising edge detector 86, which issues a high level (OUT$_{86}$) to OR gate 94 and thus to the reset input of clock generator 212. This pulse from OR gate 94 causes clock generator 212 to reset its Q output. As a result, the high level phase of the first cycle of the clock signal on line CORECLK is determined by the delay period $\delta_{214}$.

The rising edge of line CLKIN ripples next through delay stage 216 which, after delay time $\delta_{216}$, presents a rising edge to rising edge detector 88. A pulse (see OUT$_{88}$) is then presented to OR gate 92, to again cause clock generator 212 to present a high level at its Q output on line CORECLK. Accordingly, the delay time $\delta_{216}$ defines the duration of the low level phase of the first cycle of the clock signal on line CORECLK.

The rising edge next ripples through delay stage 218, causing a rising edge to be presented, after an additional delay time $\delta_{218}$, to rising edge detector 90. Rising edge detector 90 then presents a pulse (see OUT$_{90}$) to OR gate 94, sending a pulse to the reset input of clock generator 212, resetting line CORECLK to a low logic level. Accordingly, the duration of the high level phase of the second cycle of the clock signal on line CORECLK is defined by the delay time $\delta_{218}$.

The Q output of clock generator 212 on line CORECLK remains at a low logic level until the next rising edge of the input clock signal on line CLKIN is received. As such, the delay times $\delta_{214}$, $\delta_{216}$, $\delta_{218}$ must, of course, be selected so that their sum does not exceed the period of the input clock signal, as such a situation would result in an unstable clock on line CORECLK. The duration of the second low phase of the output clock signal on line CORECLK is thus defined by the difference in period in the input clock signal less the sum of the delay times $\delta_{214}$, $\delta_{216}$, $\delta_{218}$; this duration is shown in FIG. 7 as time $t_{LO}$.

The arrangement of FIG. 6 thus provides for stable frequency multiplication, independent of the phase duration or duty cycle of the input clock signal, as the phase durations are defined by the delay times in the clock control circuit. As such, the duty cycle of the input clock may vary without affecting the duty cycle of the output clock signal, particularly since the falling edge of the input clock signal is not used in, and does not affect, the generation of the output clock signal. In addition, the delay times may be selected so that alternating output clock periods can have different phase durations. Furthermore, multiplication of the input clock frequency to other integral multiples (three and up) may be readily implemented, merely by stacking additional delay stages in a similar manner, so long as the sum of the delay times is less than the period of the input clock signal.

The arrangements described hereinabove relative to FIGS. 5 and 6 may, of course, be used in conjunction with frequency divider 10 or such other clock generator or frequency synthesizer circuits as useful in the circuit utilizing the present invention. In addition, these alternative embodiments may also be constructed similarly as described hereinabove relative to FIG. 2 to responds to the state of line 2XEN, or another control signal, so that the clock doubling mode may be selectably enabled or disabled.

Figure 8:
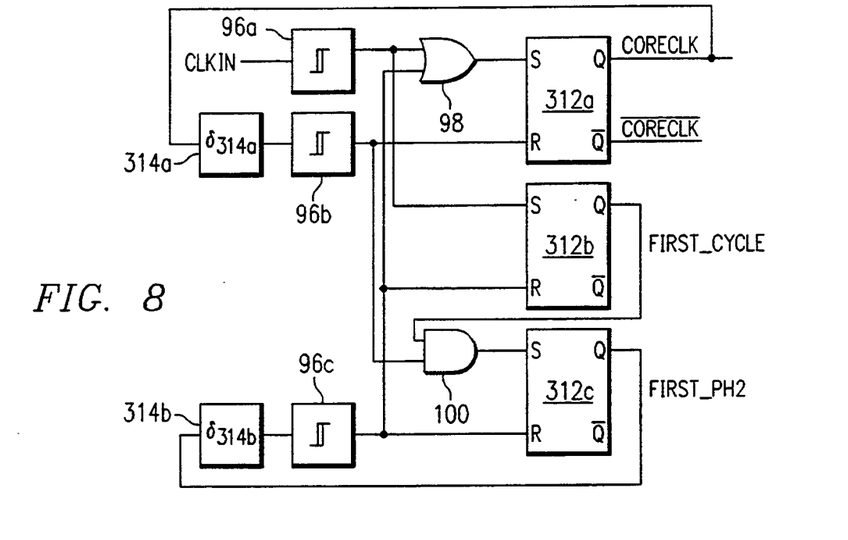
FIG. 8 is an electrical diagram, in block form of a clock generator circuit according to a third alternative embodiment of the invention.
Figure 9:
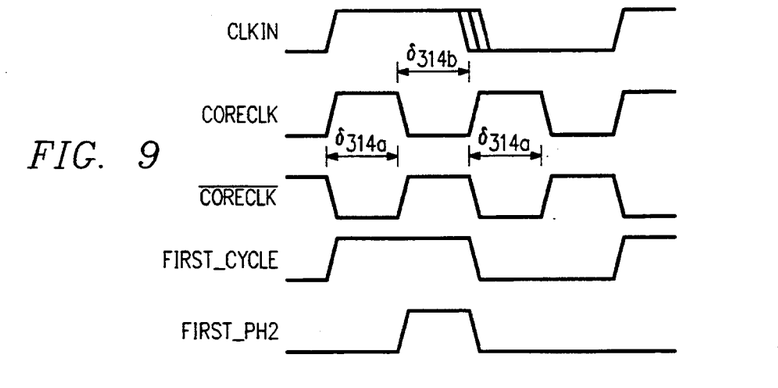
FIG. 9 is a timing diagram illustrating the operation of the circuit of FIG. 8.

FIGS. 8 and 9 illustrate a clock multiplier circuit according to another alternative embodiment of the invention. In the arrangement of FIG. 8, the frequency of the clock signal on line CORECLK is again multiplied from that on line CLKIN. In this embodiment, the frequency of CLKIN is doubled using only two delay stages 314a-b and three active edge detectors 96a-c. For purpose of illustration, active edge detectors 96a-c will be assumed to be rising edge detectors. CLKIN is received by rising edge detector 96a, whose output is connected to OR gate 98. A clock generator, shown in FIG. 8 as an SR (Set-Reset) flip-flop 312a, has its set input coupled to the output of OR gate 98. The SR flip-flop shown in FIG. 8 will output a high logic level after its set input (S) is set high and will maintain the high logic level until the reset input (R) is set high. After the reset input is set high, the SR flip-flop will output a low logic level until the set input is set high. The Q output of flip-flop 312a is the CORECLK signal. This signal is connected to delay stage 314a, constructed similarly to programmable delay stage 14 described hereinabove. The output of delay stage 314a is connected to rising edge detector 96b. The output of rising edge detector 96b is connected to the reset input of flip flop 312a and to one input of AND gate 100. The output of rising edge detector 96a is also connected to the set input of SR flip-flop 312b. The Q output of SR flip-flop 312b (the "FIRST_CYCLE" signal) is coupled to the other input of AND gate 100. The output of AND gate 100 is connected to the set input of SR flip-flop 312c. The Q output of SR flip-flop 312c comprises the "FIRST_PH2" signal which is input to delay stage 314b. The output of delay stage 314b is input to rising edge detector 96c. The output of rising edge detector 96c is connected to the reset inputs of SR flip-flops 312b and 312c and to the second input of OR gate 98.

The operation of the circuit of FIG. 8 is best described in connection with the timing diagram of FIG. 9. Upon receiving an active (in this case, rising) edge of signal CLKIN, edge detector 96a outputs a pulse to one input of OR gate 98, thereby driving its output high. This causes the Q output of SR flip-flop 312a to transition high, hence driving signal CORECLK high. The pulse generated by rising edge detector 96a also drives the set input of SR flip-flop 312b, causing the FIRST_CYCLE signal to transition high. The transition from low to high of CORECLK is delayed through delay stage 314a (by a time period of $\delta_{314a}$) and then detected by rising edge detector 96b. In response to receiving the delayed rising edge of CORECLK, rising edge detector 96b outputs a pulse to the reset input of SR flip-flop 312a and to AND gate 100. In response to this pulse, SR flip-flop drives CORECLK low. Upon receiving the pulse from edge detector 96b, AND gate 100 outputs a high pulse to the set input of SR flip-flop 312c, thereby driving the FIRST_PH2 signal high. Signal FIRST_PH2 is delayed by delay stage 314b. Thereafter, the low-to-high transition of FIRST_PH2 is detected by rising edge detector 96c. In response, edge detector 96c outputs a pulse to the reset inputs of SR flip-flops 312b and 312c and to OR gate 98. Consequently, signal CORECLK is driven high, signal FIRST_CYCLE is driven low and signal FIRST_PH2 is driven low. The low-to-high transition of CORECLK is delayed through delay stage 314a and detected by edge detector 96b. Once again, edge detector 96b causes the SR flip-flop 312a to drive CORECLK low. Since signal FIRST_CYCLE is low, the pulse received by AND gate 100 from rising edge detector 96b does not affect SR flip-flop 312c. The circuit remains in this state, with CORECLK in a low logic state, FIRST_CYCLE in an low logic state and FIRST_PH2 in a low logic state, until the next active edge is received from the CLKIN signal.

This embodiment of the present invention provides essentially the same output signal as the circuit of FIG. 6 with significantly less circuitry. In effect, SR flip-flop 312b counts to "1" and then disables SR flip-flop 312c from generating additional clocks. The circuit shown if FIG. 8 could be expanded to generate additional clocks responsive to an active CLKIN edge by setting the FIRST_CYCLE signal to "0" after counting a predetermined number of clock transitions.

Figure 10:
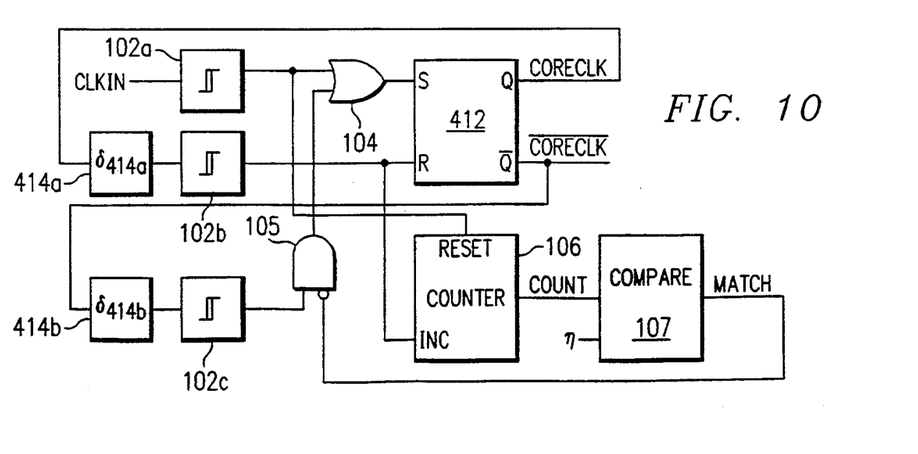
FIG. 10 is an electrical diagram, in block form, of a clock generator circuit according to a fourth alternative embodiment of the invention.
Figure 11:
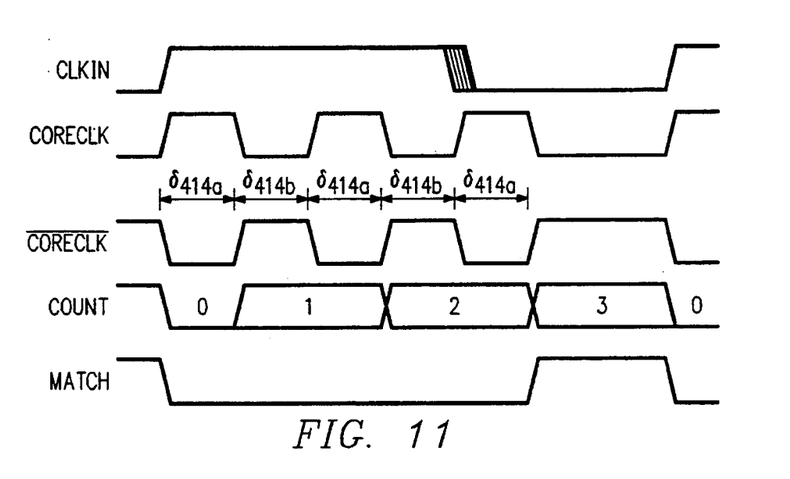
FIG. 11 is a timing diagram illustrating the operation of the circuit of FIG. 10.

FIGS. 10 and 11 illustrate another embodiment of the present invention, wherein the input clock signal CLKIN may be multiplied by a factor n, which may be stored in a register or hard-wired into the circuit. In the circuit of FIG. 10, only two delay stages 414a-b and three edge detectors 102a-c are used, regardless of the value of n. Signal CLKIN is input to edge detector 102a, whose output is received by one input of OR gate 104. The output of edge detector 102a is also connected to the reset input of counter 106. The output of OR gate 104 is coupled to set input of SR flip-flop 412, whose Q output comprises the CORECLK signal. The CORECLK signal is input to delay stage 414a whose output is connected to the input of edge detector 102b. The output of edge detector 102b is coupled to the reset input of SR flip-flop 412 and to the increment input of counter 106. The Q output of SR flip-flop 412 is received by delay circuit 414b, whose output is coupled to edge detector 102c. The output of edge detector 102c is coupled to one input of AND gate 105. The output of AND gate 105 is coupled to the other input of OR gate 104. The output of counter 106 is coupled to one input of comparator 107. The value n, which may be hardwired or stored in a register, is present on the other input of comparator 107. If the value of the output of counter 106 is equal to the value of n, the output of comparator 107, the "match" signal, transitions high. The match signal is coupled to an inverted input of AND gate 105.

The operation of the circuit of FIG. 10 will be described using n=3. An active edge of the CLKIN signal causes the edge detector 102a to generate a pulse which resets counter 106 and drives the set input of SR flip-flop 412 high, thereby causing a low-to-high transition of the CORECLK signal. Upon reset, the counter 106 outputs a count of zero, thereby driving the match signal low (unless n=0, which would be an inappropriate setting for the circuit). The low-to-high transition of CORECLK is input to edge detector 102b after the delay through delay circuit 414a. When detected by edge detector 102b, a pulse is output to the reset input of SR flip-flop 412 and to the increment input of counter 106. Hence, this pulse causes CORECLK to driven low, $\overline{\text{CORECLK}}$ to be driven high and the counter 106 to be incremented by "1". The low-to-high transition of $\overline{\text{CORECLK}}$ is detected by edge detector 102c after the delay caused by delay stage 414b. In response, edge detector 102c outputs a pulse to AND gate 105. Since the match signal is low, this pulse passes through AND gate 105. The pulse output by AND gate 105 passes through OR gate 104 to the set input of SR flip-flop 412. Consequently, CORECLK is driven high. As previously described, the low-to-high transition of CORECLK is delayed through delay stage 414a and detected by edge detector 102b which outputs a pulse to drive CORECLK low and to increment the counter 106. Since the output of counter 106 now equals "2", the match signal remains low, and detection by edge detector 102c of the delayed low-to-high transition $\overline{\text{CORECLK}}$ drives the output of AND gate 105 high, thereby causing a low-to-high transition of CORECLK. The low-to-high transition of CORECLK is delayed through delay stage 414a and detected by edge detector 102b which drives CORECLK low and increments the counter 106 to a count of "3". A count of "3" causes a match in comparator 107, thereby driving the match signal high. A high match signal drives the output of AND gate 105 low regardless of the output of edge detector 102c. Therefore, the next pulse from edge detector 102c caused by the low-to-high transition of $\overline{\text{CORECLK}}$ is blocked by AND gate 105. Consequently, the CORECLK signal will remain in a low state until the next active edge of the CLKIN signal.

As can be seen, the number of clock cycles generated by SR flip-flop 412 in response to each active edge of the CLKIN signal is dependent on the value of n. The delay caused by delay stage 414a sets the time of the high logic level phase of that CORECLK. The delay generated by delay stage 414b sets the time of the low logic level phase of CORECLK except for the last low logic state which is determined not by the delay stage 414b, but instead by the occurrence of the next active edge of the CLKIN signal.

Figure 12:
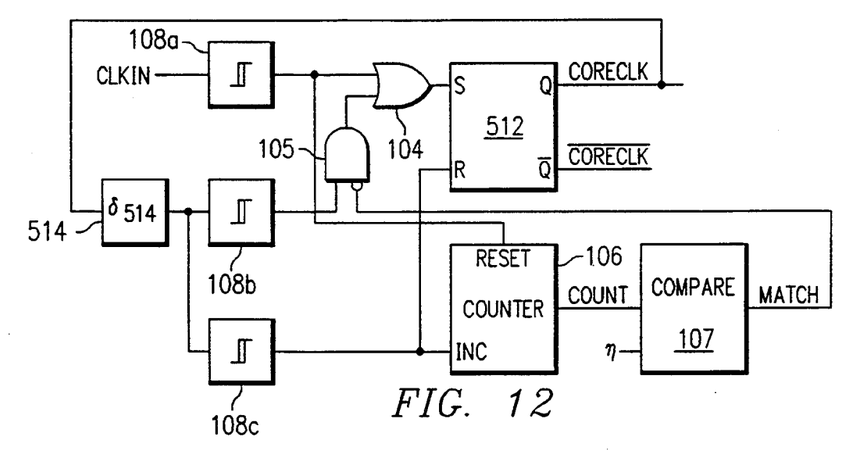
FIG. 12 is an electrical diagram, in block form, of a clock generator circuit according to a fifth alternative embodiment of the invention.
Figure 13:
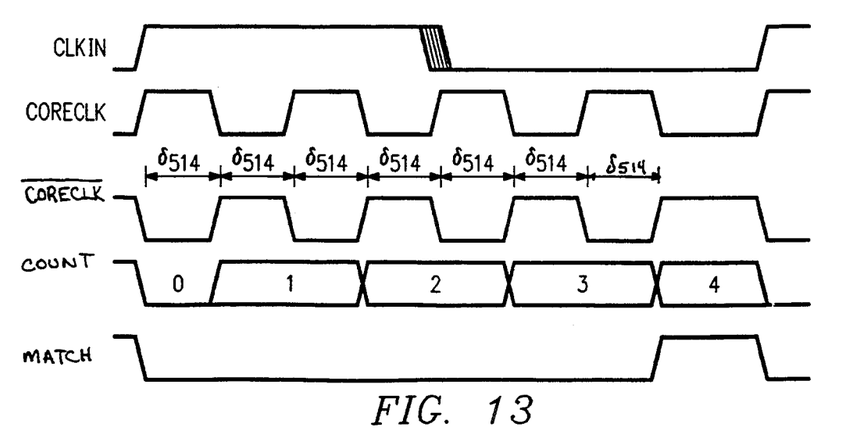
FIG. 13 is a timing figure illustrating the operation of the circuit of FIG. 12.

FIGS. 12 and 13 illustrate a clock multiplying circuit using a single delay stage 514 to multiply an input clock by a factor of n. This circuit operates similarly to the circuit of FIG. 10, except the delay stage 514 sets the times for both the high and low logic levels of output CORECLK. In operation, edge detector 108a detects the active edge of signal CLKIN. In response to detecting an active edge, 108a outputs a pulse to OR gate 104 which drives the set input of SR flip-flop 512 high, thereby driving the CORECLK signal high. The pulse also resets counter 106. A low-to-high transition of CORECLK is delayed through delay stage 514 and input to falling edge detector 108b and rising edge detector 108c. In response to the low-to-high transition of CORECLK, edge detector 108c outputs a pulse to increment counter 106 and to drive the reset input of SR flip-flop 512 high, thereby driving CORECLK low. The match signal output from comparator 107 remains low until the value output from counter 106 equals the value n at the input of the comparator 107. The high-to-low transition of CORECLK is detected by falling edge detector 108b, after the delay caused by delay stage 514. In response to detecting the high-to-low transition of CORECLK, edge detector 108b outputs a pulse to AND gate 105. While the match signal is low, a pulse from edge detector 108b generates a similar pulse on the output of AND gate 105, which drives the set input of SR flip-flop 512 high, thereby causing a low-to-high transition of the CORECLK signal.

Hence, the falling edge detector 108b detects a high-to-low transition of CORECLK after a delay specified by the delay stage 514 and in response to such detection drives CORECLK high. Similarly, the rising edge detector 108c detects a low-to-high transition of CORECLK after the delay specified by delay stage 514 and drives CORECLK low in response thereto. Upon each high-to-low transition detected by rising edge detector 108c, the counter increments. When the output of the counter equals n, the match signal is driven high, thereby blocking the next pulse to output from falling edge detector 108b. Hence, CORECLK will remain in a low state until the next active edge of CLKIN, which resets counter 106.

As can be seen, this circuit provides 50% duty cycle clocks using a single delay stage 514. Hence, the amount of circuitry needed to implement the clock multiplier circuit can be greatly reduced.

The present invention thus provides significant advantages over conventional clock doubling schemes. First, the present invention provides for the generation of an internal clock, at the fundamental frequency of the input clock signal or at multiples thereof, having a phase duration which is independent of the duty cycle of the input clock signal. As such, instabilities in the duty cycle of the input clock signal, or noise effects such as ringing and the like, do not significantly affect the internal clock signals, even at high frequencies such as above 25 MHz. Furthermore, the present invention allows for optimization of the phase duration of the internal clock signal according to the worst case logic path within the circuit, so that erroneous operation is avoided even for unstable duty cycle input clocks. In addition, the generation of the optimized phase duration by way of a delay stage may be done in such a manner as to accurately match variations in temperature, voltage, and manufacturing parameters, and in such a manner as to allow characterization and adjustment thereof. It is therefore contemplated that the present invention will greatly facilitate the generation of internal clock signals in high frequency integrated circuits, particularly those that operate over a wide operating power supply voltage range.

The present invention further allows the clock multiplier factor n to be hard-wired or stored in a memory, such that the number of output clock cycles triggered in response to an active edge of the input clock can be varied without changing the circuit design. The clock multiplier can be implemented with as little as one delay circuit.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. For example, either rising or falling edges of the input clock, or both, could be used to generate the multiplied clock. Further, logic other than SR flip-flops could be used to generate the clock transitions responsive to the output of the edge detectors. Also, as shown herein, the circuitry for counting clock transitions may be implemented using a general purpose counter or by discrete logic. The number of transitions to be counted may vary depending upon which signals are blocked in response to detection of a desired count. It is contemplated that such modifications and alternatives are within the scope of this invention as subsequently claimed herein.

What is claimed is:

1. A clock multiplier circuit for generating an output clock signal with a frequency that is a multiplication of an input clock frequency, comprising:
   (a) a detection circuit that detects an active edge of the input clock;
   (b) an edge generating circuit that includes a delay line, and that provides the output clock signal defined by output clock edges;
   (c) the edge generating circuit being responsive to the detection of an active edge of the input clock to generate a first output clock edge corresponding to the active edge, and then to generate n more output clock edges (where n is at least two) by successively feeding back through the delay line the first output clock edge and the next n−1 output clock edges; and
   (d) an inhibiting circuit responsive to the generation of output clock edges to inhibit the edge generating circuitry after generation of the n output clock edges after the first output clock edge.

2. The clock multiplier of claim 1, wherein n is equal to three such that the clock multiplier output has a frequency that is 2X the input clock frequency.

3. The clock multiplier of claim 1 wherein said inhibiting circuitry is reset responsive to detection of an active edge of the input clock.

4. The clock multiplier of claim 1 wherein said edge generating circuitry comprises:
   delay circuitry that receives a signal and outputs said same signal after a predefined delay;
   edge detection circuitry coupled to said delay circuitry that detects a predetermined transition of the output of said delay circuitry and generates a detection signal in response thereto; and
   transition circuitry that generates a clock edge transition responsive to said edge detection circuitry.

5. The clock multiplier of claim 4 wherein said transition circuitry comprises a SR flip flop circuit.

6. The clock multiplier of claim 1 wherein said inhibiting circuitry comprises:
   counting circuitry for counting generated output clock edges; and
   comparator circuitry for comparing the output of said counting circuitry with a predetermined number and for generating an inhibiting signal indicating whether the output of said counting circuitry equals said predetermined number.

7. A method of generating a clock signal with a frequency that is a multiplication of an input clock frequency, comprising the steps of:
   (a) detecting an active edge of the input clock;
   (b) responsive to the detection of an active edge of the input clock, generating a first output clock edge corresponding to the active edge, and then generating n more output clock edges (where n is at least two) by successively feeding back through a delay line the first output clock edge and the next n−1 output clock edges; and
   (c) inhibiting the generation of output clock edges after generation of the n output clock edges after the first output clock edge.

8. The method of claim 7, wherein n is equal to three such that the generated clock signal has a frequency that is 2X the input clock frequency.

9. The method of claim 7 wherein said generating step comprises the step of:
   receiving a signal and outputting said same signal after a predefined delay;
   detecting a predetermined transition of the delayed signal and generating a detection signal in response thereto; and
   generating a clock transition responsive to said detection signal.

10. The method of claim 7 wherein said inhibiting step comprises the steps of:
    counting clock edges the generated output clock signal;
    comparing the number of counted edges with a predetermined number and generating an inhibiting signal indicating the output of said counting circuitry equals said predetermined number.

11. The method of claim 10 and further comprising the step of resetting the count of clock edges responsive to detection of an active edge of said input clock signal.

12. A clock multiplier circuit for generating an output clock signal with a frequency that is a multiplication of an input clock frequency, comprising:
    (a) detection means for detecting an active edge of the input clock;
    (b) edge generating means, including a delay line, responsive to the detection of an active edge of the input clock for generating a first output clock edge corresponding to the active edge, and then generating n more output clock edges (where n is at least two) by successively feeding back through the delay line the first output clock edge and the next n−1 output clock edges, thereby providing the output clock signal defined by the output clock edges; and
    (c) inhibiting means responsive to the generation of output clock edges for inhibiting the edge generating circuitry after generation of the n output clock edges after the first output clock edge.

13. The clock multiplier of claim 12, wherein n is equal to three such that the clock multiplier output has a frequency that is 2X the input clock frequency.

14. The clock multiplier of claim 12 wherein said edge generating means comprises:
    a logic gate for outputting the generated clock signal;
    delay circuitry coupled to the output of said logic gate; and
    edge detectors coupled to said delay circuitry and said logic gate for controlling the output state of said logic gate responsive to the output of said edge detectors.

15. The clock circuitry of claim 14 wherein said logic gate comprises an SR flip-flop.

16. The clock multiplier of claim 14 wherein said inhibiting circuitry comprises:
    counting circuitry for counting transitions of said generated output clock signal;
    a comparator coupled to said counting circuit; and
    logic circuitry coupled for said comparator to electrically decoupling said edge detectors from said logic gate after a predetermined number of counted transitions of said generated output clock signal.

17. The clock circuitry of claim 16 wherein said counting circuitry is reset upon detection of a next active edge of the input clock.

* * * * *